United States Patent
Hieda et al.

(10) Patent No.: US 7,123,116 B2
(45) Date of Patent: Oct. 17, 2006

(54) PHASE SHIFTER AND MULTIBIT PHASE SHIFTER

(75) Inventors: Morishige Hieda, Tokyo (JP); Kenichi Miyaguchi, Tokyo (JP); Michiaki Kasahara, Tokyo (JP); Tadashi Takagi, Tokyo (JP); Hiroshi Ikematsu, Tokyo (JP); Norio Takeuchi, Tokyo (JP); Hiromasa Nakaguro, Tokyo (JP); Kazuyoshi Inami, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/476,384

(22) PCT Filed: Mar. 26, 2002

(86) PCT No.: PCT/JP02/02929

§ 371 (c)(1),
(2), (4) Date: Oct. 30, 2003

(87) PCT Pub. No.: WO02/093743

PCT Pub. Date: Nov. 21, 2002

(65) Prior Publication Data

US 2004/0145429 A1    Jul. 29, 2004

(30) Foreign Application Priority Data

May 14, 2001    (JP)    ............................ 2001-143654

(51) Int. Cl.
*H03H 7/20* (2006.01)
*H03H 11/20* (2006.01)

(52) U.S. Cl. ...................... 333/164; 333/103; 333/139

(58) Field of Classification Search ................ 333/103, 333/139, 156, 161, 164
See application file for complete search history.

(56) References Cited

U.S. PATENT DOCUMENTS

| | | | | |
|---|---|---|---|---|
| 5,039,873 A | * | 8/1991 | Sasaki | 333/164 |
| 5,128,639 A | * | 7/1992 | Ueda et al. | 333/164 |
| 5,317,290 A | | 5/1994 | Jacomb-Hood | |
| 5,424,696 A | * | 6/1995 | Nakahara et al. | 333/156 |
| 5,701,107 A | * | 12/1997 | Kasahara et al. | 333/164 |
| 6,114,923 A | * | 9/2000 | Mizutani | 333/103 |
| 6,118,985 A | * | 9/2000 | Kawakyu et al. | 333/103 |

FOREIGN PATENT DOCUMENTS

| | | | |
|---|---|---|---|
| JP | 2-151113 A | | 6/1990 |
| JP | 8-250963 A | | 9/1996 |
| JP | 2001339276 A | * | 12/2001 |

OTHER PUBLICATIONS

C.F Campbell et al., 2000 IEEE MTT-S, International Microwave Symposium Digest, vol. 1 of 3, Jun. 2000, pp. 217-220.

* cited by examiner

*Primary Examiner*—Seungsook Ham
(74) *Attorney, Agent, or Firm*—Birch, Stewart, Kolasch & Birch, LLP

(57) ABSTRACT

A phase shifter includes an FET 2a having its drain electrode connected to an input/output terminal 1a; and FET 2b having its drain electrode connected to the source electrode of the FET 2a and its source electrode connected to an input/output terminal 1b; and FET 2c having its drain electrode connected to the source electrode of the FET 2a; and an inductor 3a having its first terminal connected to the source electrode of the FET 2c and its second terminal connected to a ground. It can reduce the insertion loss by narrowing the gate width of the FET 2a, and carries out the phase shift of a high-frequency signal with suppressing the reflection.

10 Claims, 9 Drawing Sheets

FIG.8

| | π TYPE | COMPARISON | T TYPE |
|---|---|---|---|
| INDUCTOR ($L_P$) | $L_P = \dfrac{1}{\omega \cdot \tan\left(\dfrac{\theta}{2}\right)}$<br><br>TWO (BESIDES THOSE FOR RESONANCE) | ≧ | $L_P = \dfrac{1}{\omega \cdot \sin(\theta)}$<br><br>ONE (BESIDES THOSE FOR RESONANCE) |
| CAPACITOR ($C_S$) (∝FET SIZE) | $C_S = \dfrac{1}{\omega \cdot \sin(\theta)}$<br><br>ONE | ≦ | $C_S = \dfrac{1}{\omega \cdot \tan\left(\dfrac{\theta}{2}\right)}$<br><br>TWO |
| REFLECTION IN PHASE DELAY STATE | $\|S_{11}\| = \dfrac{\omega C_P \tan\left(\dfrac{\theta}{2}\right)}{\sqrt{\left(\tan\left(\dfrac{\theta}{2}\right) - \omega C_P\right)^2 + \left(\omega C_P \tan\left(\dfrac{\theta}{2}\right)\right)^2}}$ | > | $\|S_{11}\| = \dfrac{\omega C_P \sin(\theta)}{\sqrt{(\sin(\theta) - \omega C_P)^2 + (\omega C_P \sin(\theta))^2}}$ |

PHASE SHIFTER AND MULTIBIT PHASE SHIFTER

This application is the national phase under 35 U.S.C. § 371 of PCT International Application No. PCT/JP02/02929 which has an International tiling date of Mar. 26, 2002, which designated the United States of America.

TECHNICAL FIELD

The present invention relates to a phase shifter and multiple-bit phase shifter for electrically varying the pass phase of a signal in the microwave band or millimeter-wave band.

BACKGROUND ART

FIG. 1 is a circuit diagram showing a configuration of a conventional phase shifter disclosed in "2000 IEEE Microwave Theory and Technique Symposium Digest", for example. In FIG. 1, reference numerals 1a and 1b each designate an input/output terminal; 2a and 2b each designate an FET; 3a, 3b and 3c each designate an inductor; 4a and 4c each designate a resistor; 5a and 5b each designate a control signal terminal; and the reference numeral 8 designates a capacitor.

Next, the operation will be described.

FIG. 2 is an equivalent circuit showing the operation of the conventional phase shifter.

First, consider a case where the control signal terminal 5a is supplied with a negative voltage that will pinch off the FET 2a, and the control signal terminal 5b is supplied with a zero or positive voltage that will bring the FET 2b into conduction. In this case, the phase shifter is represented by the equivalent circuit as shown in FIG. 2.

Here, if the sum of the OFF-state capacitance of the FET 2a and the capacitance of the capacitor 8 is very small, and the ON-state resistance of the FET 2b is small, the circuit operates as a π-type high-pass filter.

Next, consider a case where the control signal terminal 5a is supplied with a zero or positive voltage that will bring the FET 2a into conduction, and the control signal terminal 5b is supplied with a negative voltage that will pinch off the FET 2b.

FIG. 3 is an equivalent circuit showing the operation of the conventional phase shifter. It shows an equivalent circuit of the phase shifter described above.

Here, if the ON-state resistance of the FET 2a is small, and if the OFF-state capacitance of the FET 2b and inductor 3c cause parallel resonance at a desired frequency, the inductors 3a and 3b have only a small effect. Thus, the circuit is equivalent to a through circuit.

Although the high-pass filter advances the phase, the through state little varies the pass phase. Accordingly, switching the control signals makes it possible to electrically switch the pass phase from the input/output terminal 1a to the input/output terminal 1b.

With the foregoing configuration, the conventional phase shifter has a problem of its considerable loss because of the reduced gate width of the FET 2a, which is designed to curb the effect of the OFF-state capacitance of the FET 2a in the pinched-off state.

The present invention is implemented to solve the foregoing problem. Therefore an object of the present invention is to provide a compact and low-loss phase shifter and multiple-bit phase shifter.

DISCLOSURE OF THE INVENTION

According to a first aspect of the present invention, there is provided a phase shifter comprising: a first field effect transistor having its first channel electrode connected to a first input/output terminal; a second field effect transistor having its first channel electrode connected to a second channel electrode of the first field effect transistor, and its second channel electrode connected to a second input/output terminal; a third field effect transistor having its first channel electrode connected to the second channel electrode of the first field effect transistor; and an inductor having its first terminal connected to a second channel electrode of the third field effect transistor, and its second terminal connected to a ground.

Thus, it offers an advantage of being able to implement a compact and low-loss phase shifter.

According to a second aspect of the present invention, there is provided a phase shifter comprising: a first field effect transistor having its first channel electrode connected to a first input/output terminal; a second field effect transistor having its first channel electrode connected to a second channel electrode of the first field effect transistor, and its second channel electrode connected to a second input/output terminal; an inductor having its first terminal connected to the second channel electrode of the first field effect transistor; and a third field effect transistor having its first channel electrode connected to a second terminal of the inductor, and its second channel electrode-connected to a ground.

Thus, it offers an advantage of being able to implement a compact and low-loss phase shifter.

According to a third aspect of the present invention, there is provided a multiple-bit phase shifter having a phase shifter and a 180° bit phase shifter used in combination with the phase shifter, the phase shifter comprising: a first field effect transistor having its first channel electrode connected to a first input/output terminal; a second field effect transistor having its first channel electrode connected to a second channel electrode of the first field effect transistor, and its second channel electrode connected to a second input/output terminal; a third field effect transistor having its first channel electrode connected to the second channel electrode of the first field effect transistor; and an inductor having its first terminal connected to a second channel electrode of the third field effect transistor, and its second terminal connected to a ground, wherein a circuit constant of the phase shifter is set such that an amount of phase shift becomes 90°.

Thus, it offers an advantage of being able to implement a compact and low-loss multiple-bit phase shifter.

BRIEF DESCRIPTION OF THE DRAWINGS

FIG. 8 is a table showing filter characteristics;

BEST MODE FOR CARRYING OUT THE INVENTION

The best mode for carrying out the invention will now be described with reference to the accompanying drawings to explain the invention in more detail.

Embodiment 1

Figure 1:
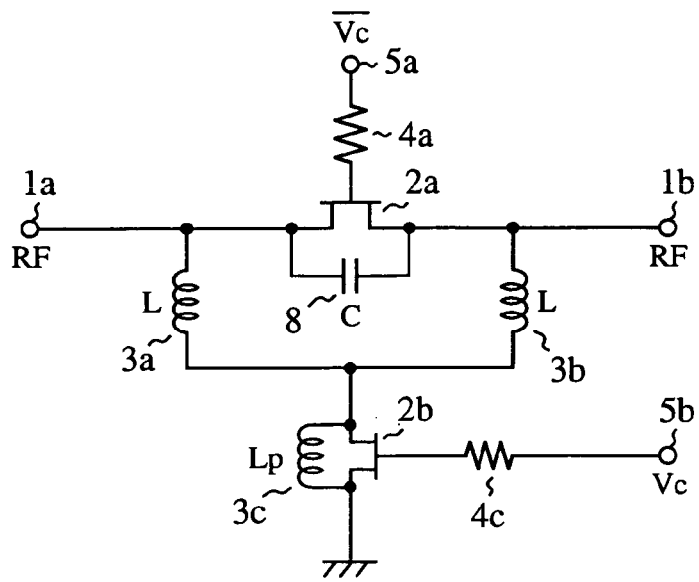
FIG. 1 is a circuit diagram showing a configuration of a conventional phase shifter.
Figure 2:
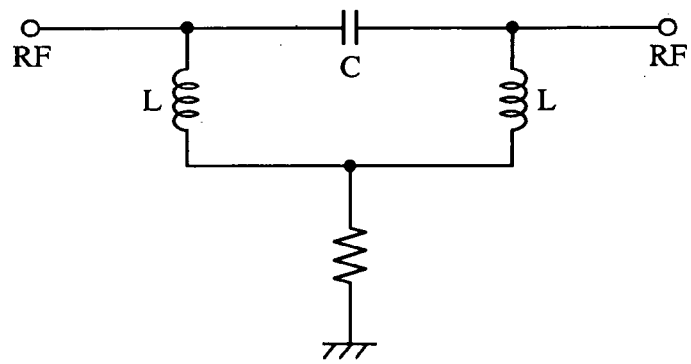
FIG. 2 is an equivalent circuit diagram showing the operation of the conventional phase shifter.
Figure 3:
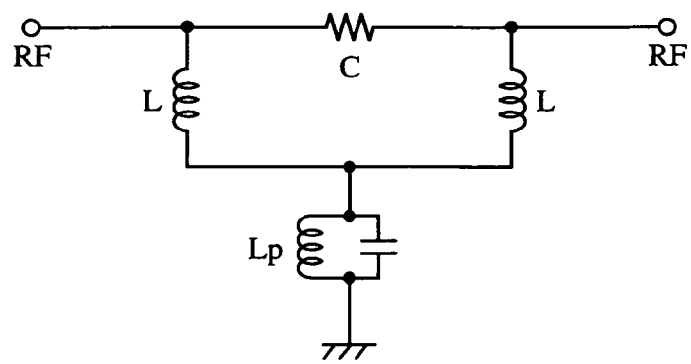
FIG. 3 is an equivalent circuit diagram showing the operation of the conventional phase shifter.
Figure 4:
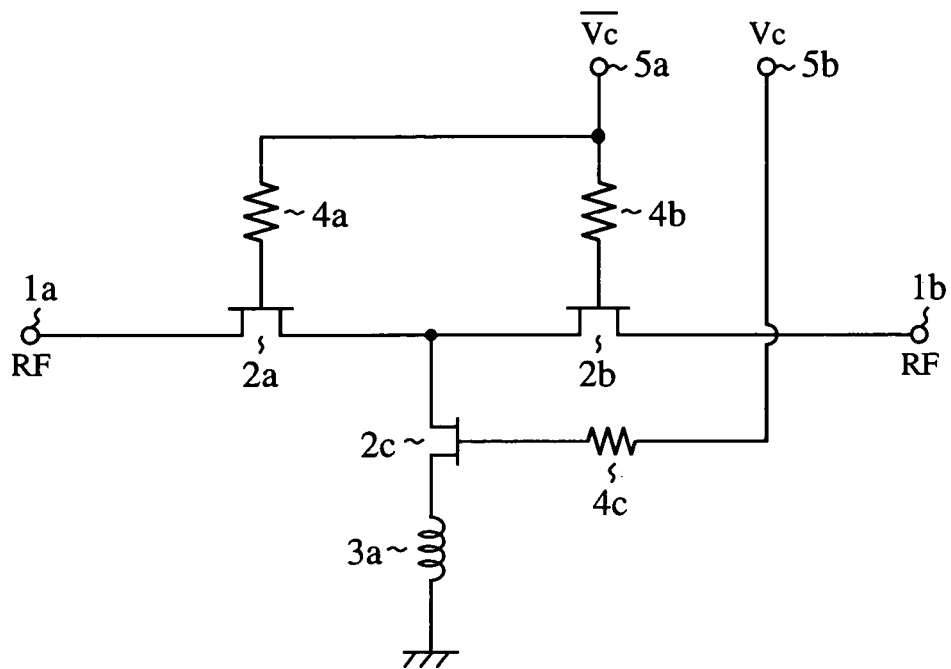
FIG. 4 is a circuit diagram showing a configuration of a phase shifter of an embodiment 1 in accordance with the present invention.
Figure 5:
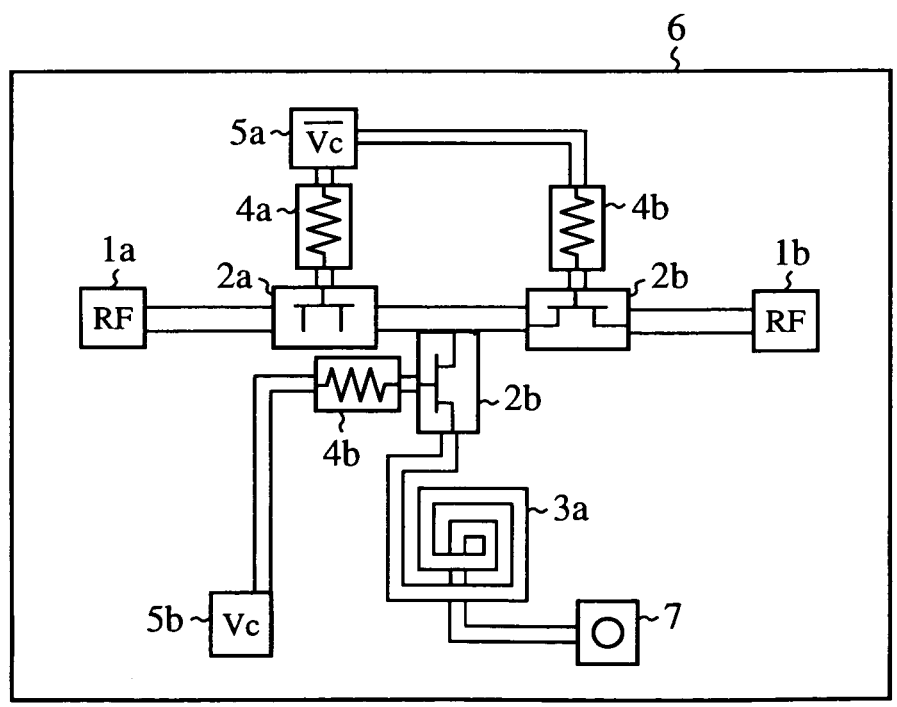
FIG. 5 is a layout diagram showing the embodiment 1 of the phase shifter in accordance with the present invention.

FIG. 4 is a circuit diagram showing a configuration of a phase shifter of an embodiment 1 in accordance with the present invention; and FIG. 5 is a layout diagram showing the embodiment 1 of the phase shifter in accordance with the present invention. In these figures, the reference numeral 1a designates an input/output terminal (first input/output terminal); 1b designates an input/output terminal (second input/output terminal); 2a designates an FET (first field effect transistor) having its drain electrode, a first channel electrode, connected to the input/output terminal 1a; 2b designates an FET (second field effect transistor) having its drain electrode, a first channel electrode, connected to the source electrode of the FET 2a, and its source electrode, a second channel electrode, connected to the input/output terminal 1b.

The reference numeral 2c designates an FET (third field effect transistor) having its drain electrode, a first channel electrode, connected to the source electrode of the FET 2a; 3a designates an inductor having its first terminal connected to the source electrode of the FET 2c, and its second terminal connected to the ground; reference numerals 4a, 4b and 4c each designate a resistor; 5a and 5b each designate a control signal terminal; the reference numerals 6 designates a semiconductor substrate; and 7 designates a through hole.

Next, the operation will be described.

Figure 6:
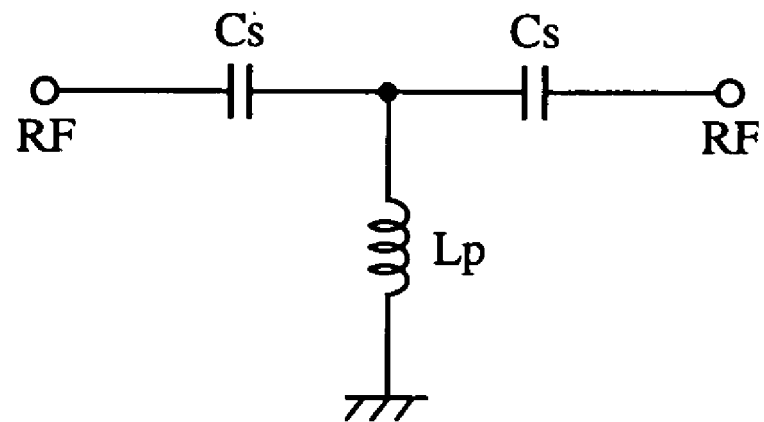
FIG. 6 is an equivalent circuit diagram showing the operation of the embodiment 1 of the phase shifter in accordance with the present invention.
Figure 7:
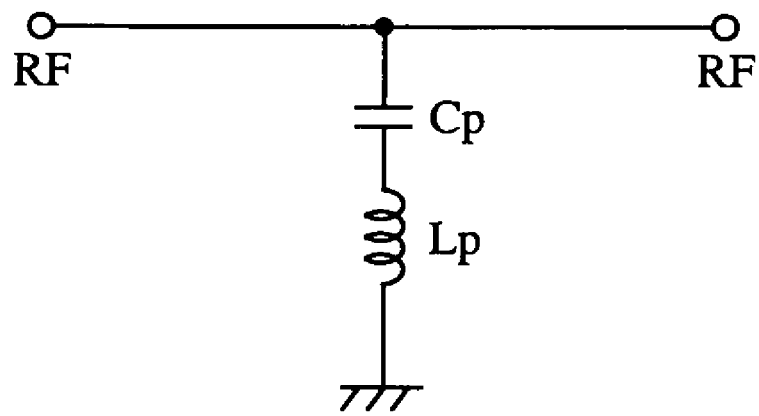
FIG. 7 is an equivalent circuit diagram showing the operation of the embodiment 1 of the phase shifter in accordance with the present invention.

FIGS. 6 and 7 are equivalent circuit diagrams each showing the operation of the phase shifter of the embodiment 1 in accordance with the present invention.

First, consider the case where the control signal terminal 5a is supplied with a bias lower than the pinch-off voltage of the FETs 2a and 2b, and the control signal terminal 5b is supplied with a bias larger than the pinch-off voltage of the FET 2c. In this case, the FETs 2a and 2b are in the OFF-state and the FET 2c is in the ON-state. Thus, the state across the drain and source of each of the FETs 2a and 2b can be considered equivalent to a capacitor, and the state across the drain and source of the FET 2c can be considered equivalent to a short circuit.

FIG. 6 is an equivalent circuit showing this state. In this state, the phase shifter operates as a T-type high-pass filter consisting of the FETs 2a and 2b equivalent to the capacitor and of the inductor 3a. Thus, the phase of the high-frequency signal passing across the input/output terminals 1a and 1b becomes an advanced state.

Next, consider the case where the FETs 2a and 2b are supplied with a gate bias greater than the pinch-off, and the FET 2c is supplied with the gate bias less than the pinch-off. In this case, the FETs 2a and 2b are in the ON-state and the FET 2c is in the OFF-state. Thus, the state across the drain and source of each of the FETs 2a and 2b can be considered equivalent to a short circuit, and the state across the drain and source of the FET 2c can be considered equivalent a capacitor.

FIG. 7 is an equivalent circuit of this state. In this state, the phase shifter operates as a circuit consisting of the FET 2c equivalent to a capacitor and of the inductor 3a. If the gate width of the FET 2c is narrowed to make the capacitance in the off state very small, the effect of the FET 2c and inductor 3a becomes negligible. Thus, the state across the input/output terminals 1a and 1b is nearly equivalent to the through state.

As described above, the pass phase can be varied by placing the FETs 2a, 2b and 2c in the ON/OFF-state.

FIG. 8 is a table showing filter characteristics.

The conventional example uses a π-type high-pass filter, and the present embodiment 1 employs a T-type high-pass filter. FIG. 8 compares the T-type high-pass filter with the π-type high-pass filter with equivalent filter characteristics, to exhibit differences in the components and the like. In FIG. 8, ω is an angular frequency, Cp is the OFF-state capacitance of the FET 2c, and θ is a desired phase shift amount.

To achieve equivalent filter characteristics, the T-type high-pass filter can reduce the inductance of the inductor and the number of the inductors as compared with the π-type high-pass filter. In addition, the T type can increase the capacitance of the high-pass filter, which is proportional to the size of the FETs 2a and 2b, as compared with the π type. Accordingly, the T-type high-pass filter can reduce the loss by decreasing the ON-state resistance of the FETs 2a and 2b. Furthermore, the π-type high-pass filter cannot achieve sufficient matching when it is in the state nearly equivalent to the through state because of increasing signal reflection due to the effect of the FET grounded via the inductor. Thus, the present embodiment can achieve better characteristics than the phase shifter using the conventional π-type high-pass filter.

Although the present embodiment 1 describes a monolithic structure that forms a circuit on the semiconductor substrate 6, this is not essential. For example, the circuit can be configured on a dielectric substrate using discrete components, offering equivalent advantages.

Although the drain electrode of the FET 2a is connected to the input/output terminal 1a in the present embodiment 1, the source electrode of the FET 2a can be connected to the input/output terminal 1a. Likewise, although the source electrode of the FET 2b is connected to the input/output terminal 1b, the drain electrode of the FET 2b can be connected to the input/output terminal 1b. In addition, although the source electrode of the FET 2c is connected to the ground, the drain electrode of the FET 2c can be connected to the ground.

Embodiment 2

Figure 9:
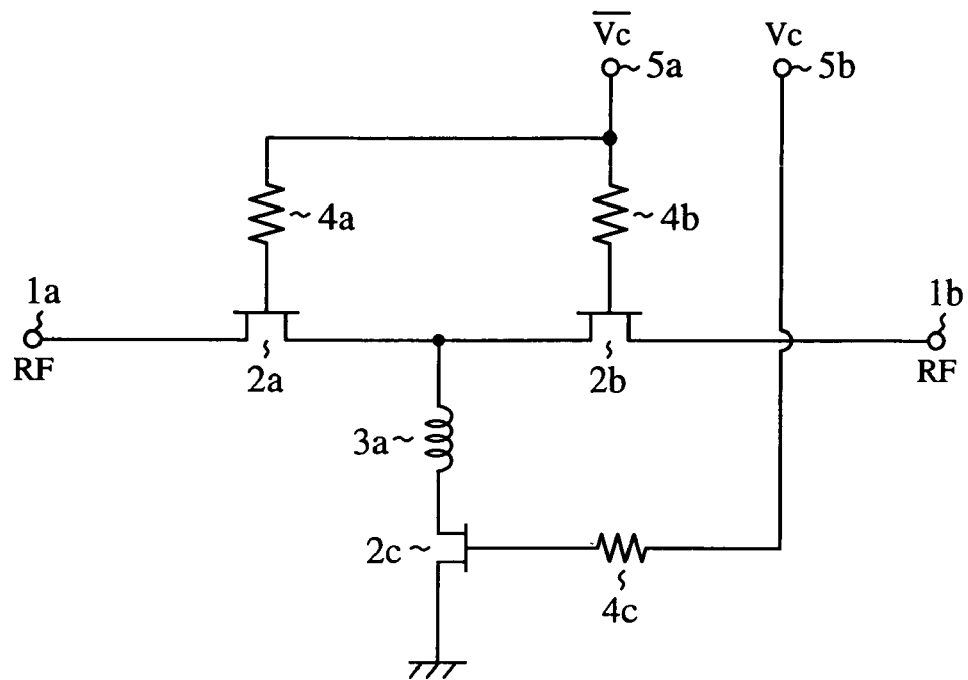
FIG. 9 is a circuit diagram showing a configuration of a phase shifter of an embodiment 2 in accordance with the present invention.

FIG. 9 is a circuit diagram showing a configuration of a phase shifter of an embodiment 2 in accordance with the present invention. In FIG. 9, the same portions as those of the phase shifter of FIG. 4 are designated by the same reference numerals, and the description thereof is omitted here. Although the phase shifter of the foregoing embodiment 1 is configured such that the FET 2c is grounded through the inductor 3a as shown in FIG. 4, the inductor 3a can be grounded through the FET 2c as shown in FIG. 9, offering the effect and advantages equivalent to those of the phase shifter of the foregoing embodiment 1.

Embodiment 3

Figure 10:
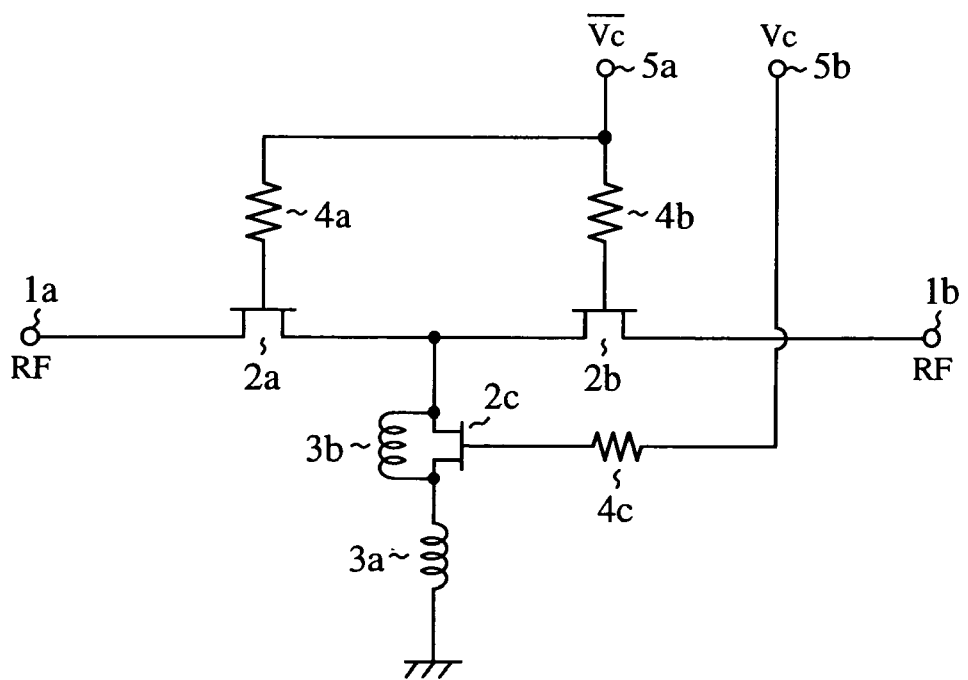
FIG. 10 is a circuit diagram showing a configuration of a phase shifter of an embodiment 3 in accordance with the present invention.

FIG. 10 is a circuit diagram showing a configuration of a phase shifter of an embodiment 3 in accordance with the present invention. In FIG. 10, the same portions as those of the phase shifter of FIG. 4 are designated by the same reference numerals, and the description thereof is omitted here. In FIG. 10, the reference numeral 3b designates an inductor connected in parallel with the FET 2c.

The phase shifter of the foregoing embodiment 1 brings the inductor 3a whose one end is grounded into ON/OFF-state through the FET 2c. In contrast, the present embodiment 3 includes an additional inductor 3b connected in parallel with the FET 2c as shown in FIG. 10 to form a parallel resonance circuit, thereby implementing a configuration achieving comparable effect and advantages by bringing the inductor 3a into ON/OFF-state.

Next, the operation will be described.

Consider the case where the FETs 2a and 2b are supplied with a gate bias greater than the pinch-off voltage, and the FET 2c is supplied with a gate bias less than the pinch-off voltage. In this case, the FETs 2a and 2b are in the ON-state and the FET 2c is in the OFF-state. Accordingly, the state across the drain and source of each of the FETs 2a and 2b can be considered equivalent to a short circuit, and the state across the drain and source of the FET 2c can be considered equivalent to a capacitor.

In this state, causing the FET 2c and inductor 3b to produce parallel resonance at a desired frequency can reduce the effect of the inductor 3a so that the inductor 3a becomes negligible. In this case, the state across the input/output terminals 1a and 1b becomes equivalent to the through state.

As described above, bringing the FETs 2a and 2b into the ON-state and the FET 2c into the OFF-state enables the phase shifter to vary the pass phase.

Embodiment 4

Figure 11:
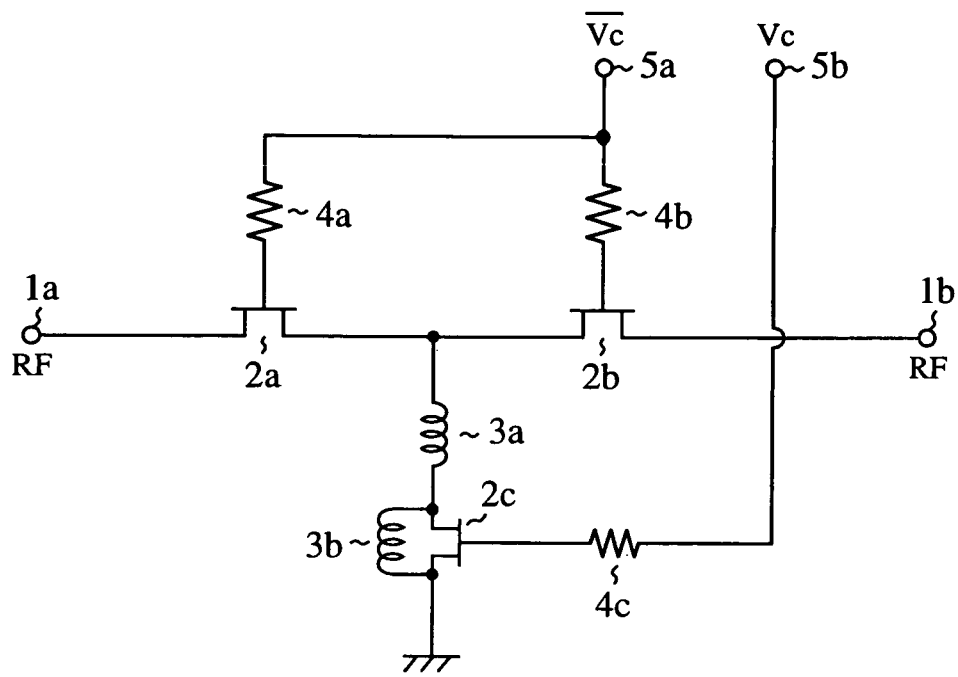
FIG. 11 is a circuit diagram showing a configuration of a phase shifter of an embodiment 4 in accordance with the present invention.

FIG. 11 is a circuit diagram showing a configuration of a phase shifter of an embodiment 4 in accordance with the present invention. In FIG. 11, the same portions as those of the phase shifters of FIGS. 4 and 10 are designated by the same reference numerals, and the description thereof is omitted here.

The relationship of the connection of the inductor 3a with the FET 2c and inductor 3b as shown in the FIG. 10 can be reversed as shown in FIG. 11, offering comparable effect and advantages. In addition, comparable effect and advantages can be achieved by connecting the inductor 3b to both sides of the FET 2c and inductor 3a (not shown).

Embodiment 5

Figure 12:
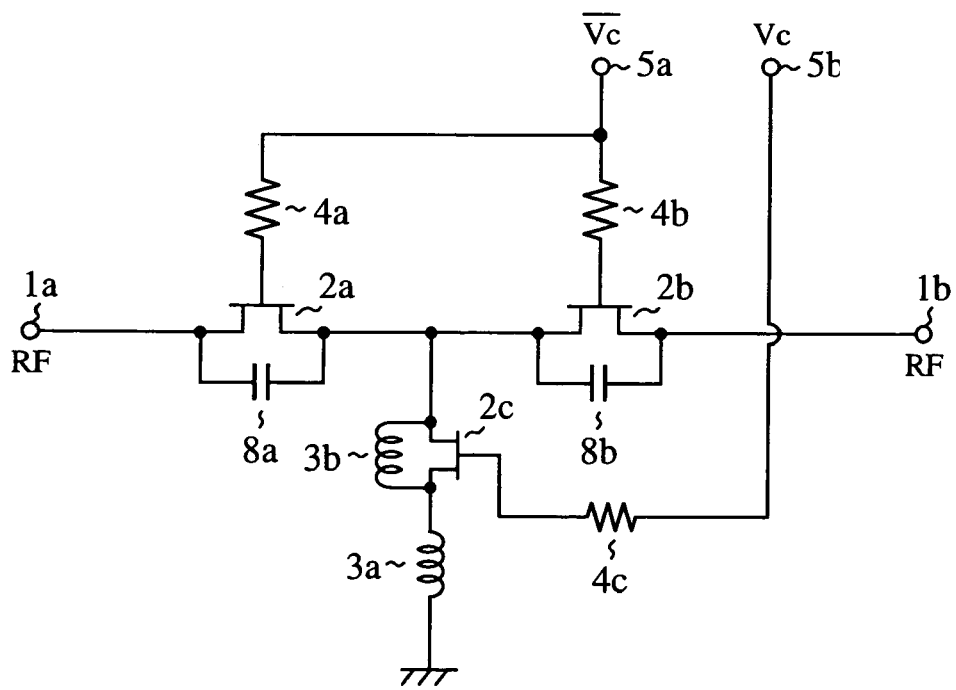
FIG. 12 is a circuit diagram showing a configuration of a phase shifter of an embodiment 5 in accordance with the present invention.

FIG. 12 is a circuit diagram showing a configuration of a phase shifter of an embodiment 5 in accordance with the present invention. In FIG. 12, the same portions as those of the phase shifters of FIGS. 4 and 10 are designated by the same reference numerals, and the description thereof is omitted here. In FIG. 12, the reference numeral 8a designates a capacitor connected in parallel with the FET 2a, and 8b designates a capacitor connected in parallel with the FET 2b.

In the foregoing embodiment 1, although the FETs 2a and 2b are used as the capacitors for varying the pass phase in the high-pass filter, this is not essential. For example, the configuration as shown in FIG. 12, which connects the capacitors 8a and 8b in parallel with the FETs 2a and 2b, can implement comparable effect and advantages.

Next, the operation will be described.

First, consider the case where the control signal terminal 5a is supplied with a gate bias lower than the pinch-off voltage of the FETs 2a and 2b, and the control signal terminal 5b is supplied with a gate bias greater than the pinch-off voltage of the FET 2c, so that the FETs 2a and 2b are in the OFF-state and the FET 2c is in the ON-state. In this case, the state across the drain and source of each of the FETs 2a and 2b can be considered equivalent to a capacitor, and the state across the drain and source of the FET 2c can be considered equivalent to a short circuit. Thus, the phase shifter operates as a T-type high-pass filter consisting of the FETs 2a and 2b equivalent to the capacitors, capacitors 8a and 8b, and inductor 3a.

As described above, turning on and off the FETs 2a, 2b and 2c enables the phase shifter to vary the phase of the pass signal.

In addition, when the capacitance per unit area of the capacitors 8a and 8b is greater than that of the FETs 2a and 2b, the present embodiment 5 can reduce its size as compared with the case where these capacitors are implemented by using only the FETs 2a and 2b.

Furthermore, varying the size with maintaining the total capacitance of the FET 2a and capacitor 8a and the total capacitance of the FET 2b and capacitor 8b makes it possible to vary the ON-state resistance of the FETs 2a and 2b, and hence the insertion loss with maintaining the amount of phase shift, thereby being able to reduce the loss difference at the phase switching.

Embodiment 6

Figure 13:
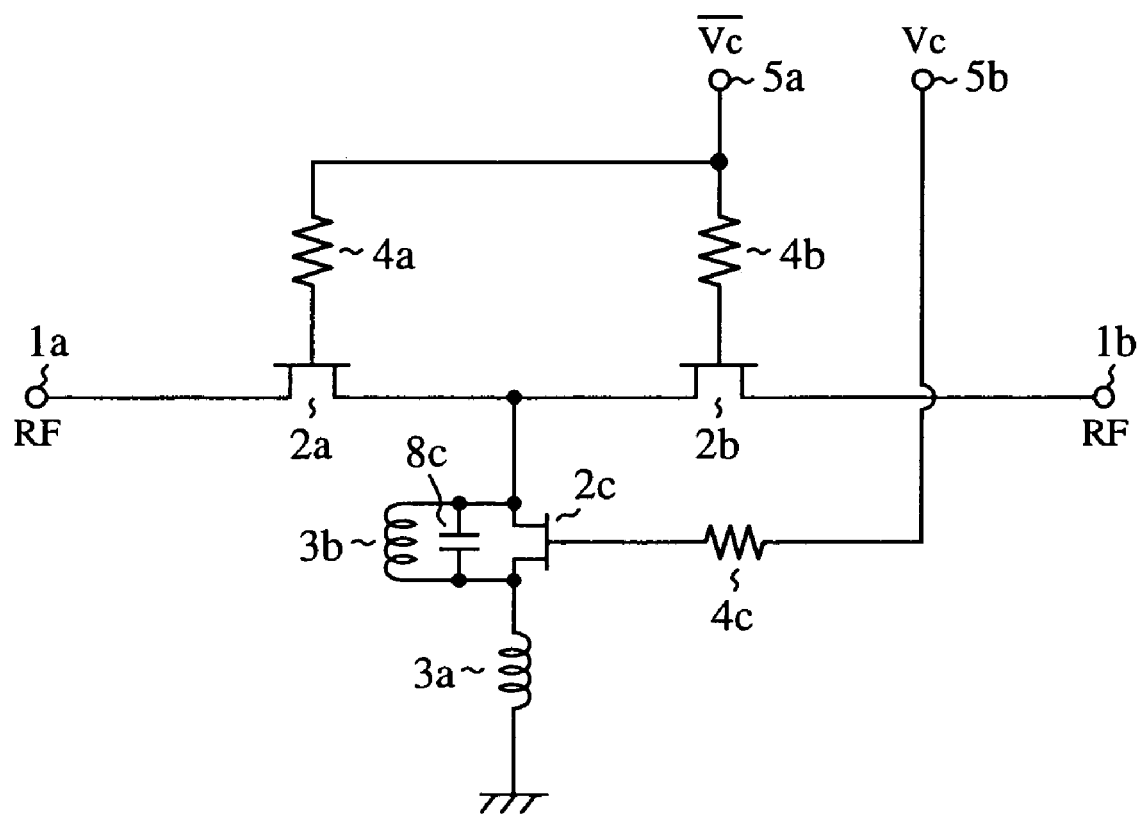
FIG. 13 is a circuit diagram showing a configuration of a phase shifter of an embodiment 6 in accordance with the present invention.

FIG. 13 is a circuit diagram showing a configuration of a phase shifter of an embodiment 6 in accordance with the present invention. In FIG. 13, the same portions as those of the phase shifters of FIGS. 4 and 10 are designated by the same reference numerals, and the description thereof is omitted here. In FIG. 13, the reference numeral 8c designates a capacitor connected in parallel with the FET 2c.

Although the foregoing embodiment 5 handles the configuration in which the capacitors 8a and 8b are connected in parallel with the FETs 2a and 2b that are connected to the input/output terminals 1a and 1b, this is not essential. For example, connecting the capacitor 8c in parallel with the FET 2c and inductor 3b for turning on and off the inductor 3a whose one end is grounded can implement comparable effect and advantages.

Next, the operation will be described.

Consider the case where the FETs 2a and 2b are supplied with a gate bias greater than the pinch-off voltage, and the FET 2c is supplied with a gate bias less than the pinch-off voltage. In this case, the FETs 2a and 2b are in the ON-state and the FET 2c is in the OFF-state. Accordingly, the state across the drain and source of each of the FETs 2a and 2b can be considered equivalent to a short circuit, and the state across the drain and source of the FET 2c can be considered equivalent to a capacitor. In this state, causing the FET 2c, inductor 3b and capacitor 8c to produce parallel resonance at a desired frequency can reduce the effect of the inductors 3a and 3b to a level they are negligible.

As described above, bringing the FETs 2a, 2b and 2c into the ON/OFF-state enables the phase shifter to vary the phase of the pass signal.

In addition, when the capacitance per unit area of the capacitor 8c is greater than that of the FET 2c, the present embodiment 6 can reduce its size as compared with the case where the capacitor is implemented by using only the FET 2c.

Furthermore, varying the size of the FET 2c and capacitor 8c with maintaining their total capacitance makes it possible to vary the insertion loss with maintaining the amount of phase shift, thereby enabling the reduction in the loss difference at the phase switching.

Embodiment 7

Figure 14:
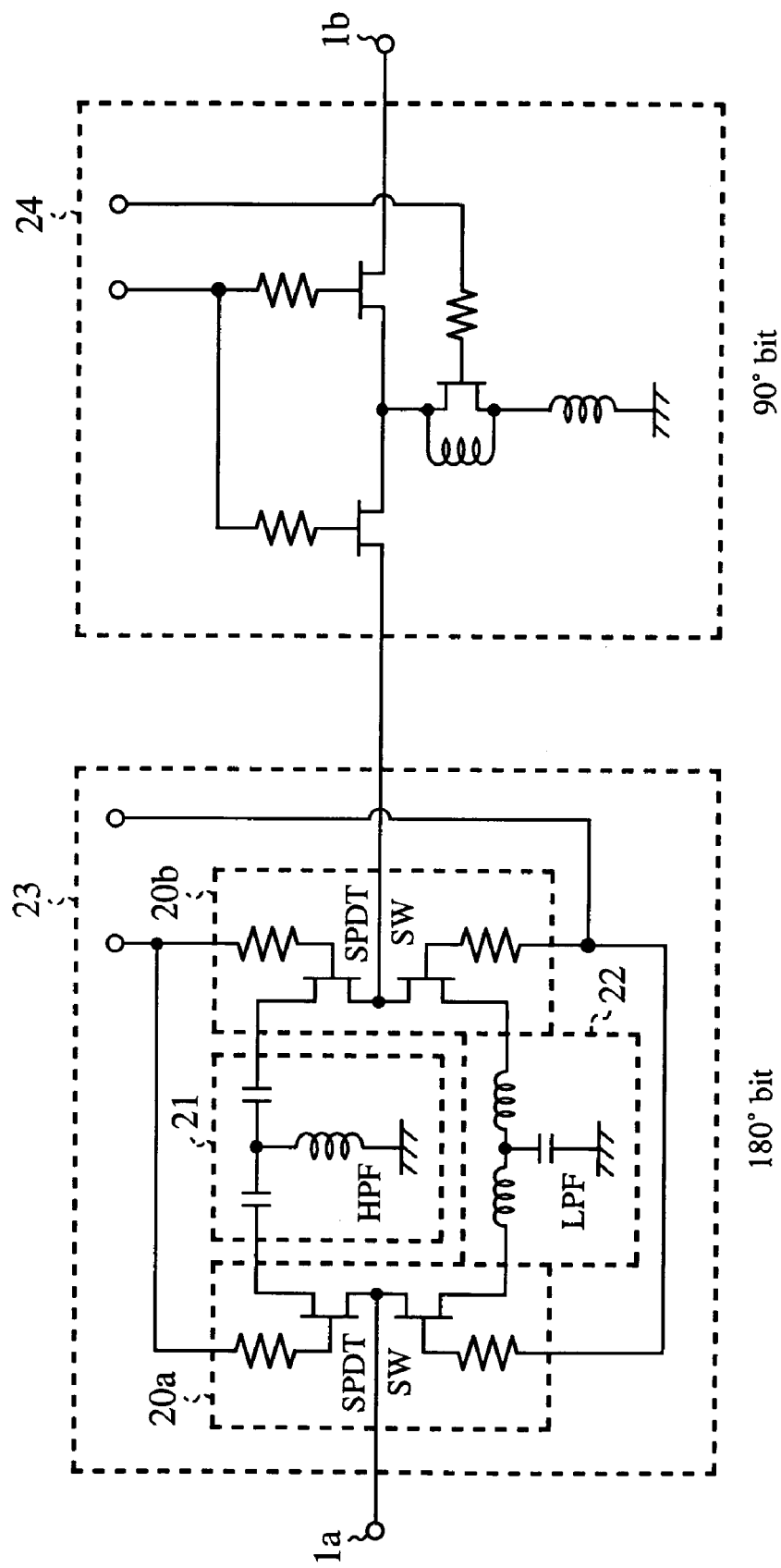
FIG. 14 is a circuit diagram showing a configuration of a multiple-bit phase shifter of an embodiment 7 in accordance with the present invention.

FIG. 14 is a circuit diagram showing a configuration of a multiple-bit phase shifter of an embodiment 7 in accordance with the present invention. In FIG. 14, reference numerals 20a and 20b each designate an SPDT switch, the reference numeral 21 designates a high-pass filter, 22 designates a low-pass filter, 23 designates a 180° bit phase shifter, and 24 designates a 90° bit phase shifter. The 90° bit phase shifter 24 can use the phase shifter of the embodiments 1–6, for example. The phase shifter 24 as shown in FIG. 14 is an example using the phase shifter of the embodiment 3.

Next, the operation will be described.

The path, through which the high-frequency signal supplied to the input/output terminal 1a passes, is switched by the SPDT switches 20a and 20b. First, when it passes through the high-pass filter 21, the pass phase is advanced by the high-pass filter 21. In contrast, when it passes through the low-pass filter 21, the pass phase is delayed by the low-pass filter 22. Setting the phase difference between the phase advanced by the high-pass filter 21 and the phase delayed by the low-pass filter 22 at 180° enables a 180° phase shifter.

Next, setting the circuit constant of the 90° bit phase shifter such that the amount of phase shift becomes 90°, the 90° phase shifter 24 can shift the phase by 90°.

With the configuration as described above, the multiple-bit phase shifter of the embodiment 7 operates as a 2-bit phase shifter that switches its pass phase at 90° steps.

Embodiment 8

Figure 15:
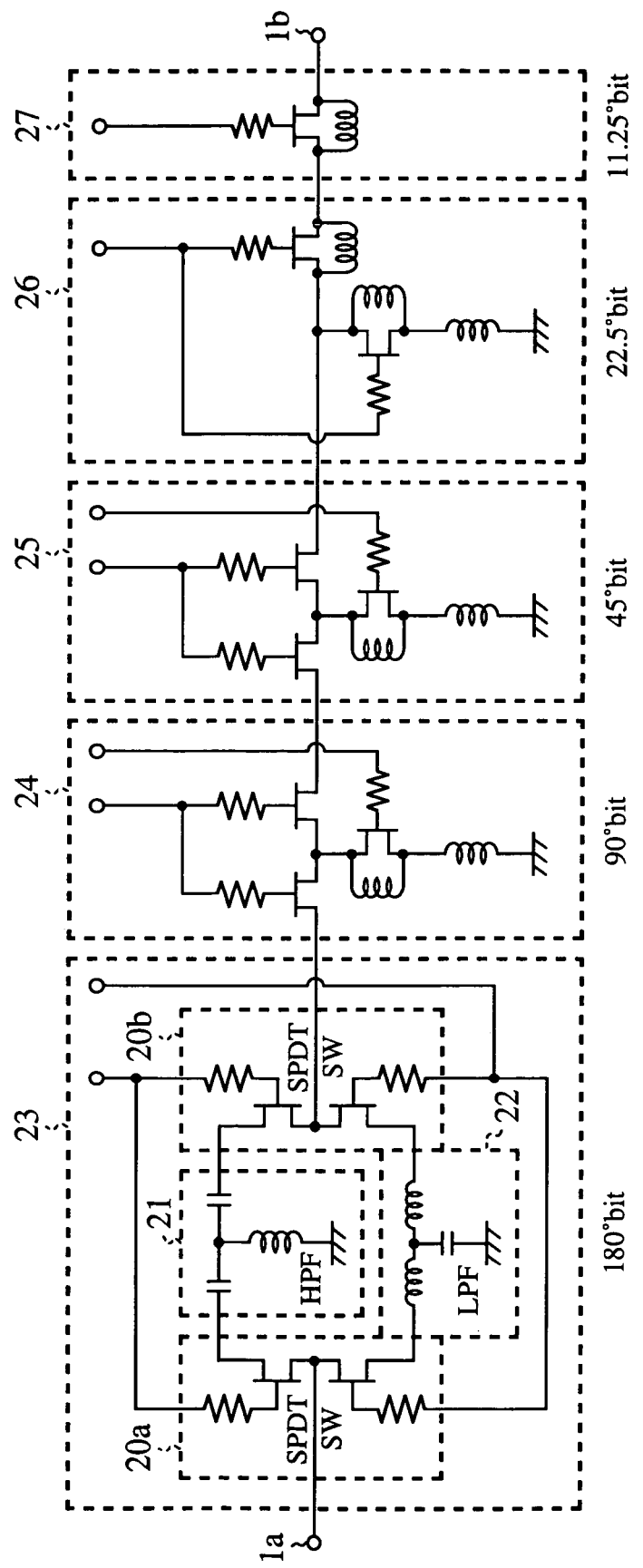
FIG. 15 is a circuit diagram showing a configuration of the multiple-bit phase shifter of an embodiment 8 in accordance with the present invention.

FIG. 15 is a circuit diagram showing a configuration of a multiple-bit phase shifter of an embodiment 8 in accordance with the present invention. In FIG. 15, the same portions as those of the multiple-bit phase shifter of FIG. 14 are designated by the same reference numerals, and the description thereof is omitted here. In FIG. 15, the reference numeral 25 designates a 45° bit phase shifter, 26 designates a 22.5° bit phase shifter, and 27 designates an 11.25° bit phase shifter. Although the phase shifters 24 and 25 of the multiple-bit phase shifter as shown in FIG. 15 are an example using the phase shifter of the embodiment 3, they can use any of the phase shifters of the embodiments 1–6.

With the configuration, the multiple-bit phase shifter of the embodiment 8 operates as a 5-bit phase shifter that switches the pass phase by 11.250 ° steps.

INDUSTRIAL APPLICABILITY

As described above, the phase shifter and multiple-bit phase shifter in accordance with the present invention are suitable for shifting the phase of a high-frequency signal with reducing the insertion loss and achieving the sufficient matching with reducing the reflection of the signal.

What is claimed is:

1. A phase shifter comprising:
a first field effect transistor having its first channel electrode directly connected to a first input/output terminal;
a second field effect transistor having its first channel electrode directly connected to a second channel electrode of said first field effect transistor, and its second channel electrode connected directly to a second input/output terminal;
a third field effect transistor having its first channel electrode connected directly to the second channel electrode of said first field effect transistor;
a first inductor having its first terminal connected to a second channel electrode of said third field effect transistor, and its second terminal connected directly to a ground;
a first resistor connected to a gate of the first field effect transistor;
a second resistor connected to a gate of the second field effect transistor, the first resistor and second resistor being connected in parallel;
a third resistor connected to a gate of the third field effect transistor; and
a second inductor connected between the first channel electrode and second channel electrode of said third field effect transistor.

2. The phase shifter according to claim 1, further comprising a capacitor connected between the first channel electrode and second channel electrode of each of said first and second field effect transistors.

3. The phase shifter according to claim 1, further comprising a capacitor connected between the first channel electrode and second channel electrode of said third field effect transistor.

4. The phase shifter according to claim 1, wherein a circuit constant is set such that an amount of a phase shift becomes 90°.

5. The phase shifter according to claim 1, wherein a circuit constant is set such that an amount of phase shift becomes 45°.

6. A phase shifter comprising:
a first field effect transistor having its first channel electrode directly connected to a first input/output terminal;
a second field effect transistor having its first channel electrode connected directly to a second channel electrode of said first field effect transistor, and its second channel electrode connected directly to a second input/output terminal;
a first inductor having its first terminal directly connected to the second channel electrode of said first field effect transistor;
a third field effect transistor having its first channel electrode directly connected to a second terminal of said first inductor, and its second channel electrode directly connected to a ground;
a first resistor connected to a gate of the first field effect transistor;
a second resistor connected to a gate of the second field effect transistor, the first resistor and second resistor being connected in parallel;

a third resistor connected to a gate of the third field effect transistor; and a second inductor connected between the first channel electrode and second channel electrode of said third field effect transistor.

7. The phase shifter according to claim 6, further comprising a capacitor connected between the first channel electrode and second channel electrode of each of said first and second field effect transistors.

8. The phase shifter according to claim 6, further comprising a capacitor connected between the first channel electrode and second channel electrode of said third field effect transistor.

9. The phase shifter according to claim 6, wherein a circuit constant is set such that an amount of phase shift becomes 90°.

10. The phase shifter according to claim 6, wherein a circuit constant is set such that an amount of phase shift becomes 45°.

\* \* \* \* \*